(12) United States Patent
Hong

(10) Patent No.: US 12,464,865 B2
(45) Date of Patent: Nov. 4, 2025

(54) WAFER WITH IMPROVED UNIFORMITY OF LIGHT EMITTED FROM A PLURALITY OF LEDS GROWN ON ONE WAFER

(71) Applicant: LG Display Co., Ltd., Seoul (KR)

(72) Inventor: Kiyong Hong, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 499 days.

(21) Appl. No.: 17/894,785

(22) Filed: Aug. 24, 2022

(65) Prior Publication Data

US 2023/0130895 A1 Apr. 27, 2023

(30) Foreign Application Priority Data

Oct. 21, 2021 (KR) .................. 10-2021-0141215

(51) Int. Cl.
*H10H 20/831* (2025.01)
*H10H 20/825* (2025.01)
*H10H 29/14* (2025.01)

(52) U.S. Cl.
CPC ........ *H10H 20/831* (2025.01); *H10H 20/825* (2025.01); *H10H 29/142* (2025.01)

(58) Field of Classification Search
CPC . H01L 25/0753; H01L 25/167; H10H 20/825; H10H 20/83; H10H 20/831; H10H 29/142
See application file for complete search history.

(56) References Cited

U.S. PATENT DOCUMENTS

| 2004/0046166 A1* | 3/2004 | Cho .................. H10H 20/831 |
| | | 257/13 |
| 2016/0315225 A1 | 10/2016 | Kageyama |
| 2019/0027651 A1 | 1/2019 | Simin et al. |
| 2020/0132997 A1* | 4/2020 | Ouderkirk .......... G02B 27/0101 |

FOREIGN PATENT DOCUMENTS

| CN | 112750922 A | 5/2021 |
| KR | 10-2020-0129216 A | 11/2020 |
| TW | 200919788 A | 5/2009 |

* cited by examiner

*Primary Examiner* — Matthew C Landau
*Assistant Examiner* — Dmitriy Yemelyanov
(74) *Attorney, Agent, or Firm* — Birch, Stewart, Kolasch & Birch, LLP

(57) ABSTRACT

A wafer according to an embodiment of the present disclosure includes a substrate including an active area, and a plurality of light emitting diodes (LEDs) disposed on the active area. Each of the plurality of LEDs can include an emission layer disposed on the substrate, a p-type semiconductor layer disposed on the emission layer, and a p-type electrode disposed on the p-type semiconductor layer. The size of the area of the p-type electrode can decrease as the plurality of LEDs are disposed more adjacent to a plurality of corners of the active area. Accordingly, by configuring the area of the p-type electrode of each of the plurality of LEDs differently, it is possible to reduce a wavelength deviation between the plurality of LEDs.

19 Claims, 15 Drawing Sheets

AA

WAFER WITH IMPROVED UNIFORMITY OF LIGHT EMITTED FROM A PLURALITY OF LEDS GROWN ON ONE WAFER

CROSS-REFERENCE TO RELATED APPLICATIONS

This application claims the benefit of and priority to Korean Patent Application No. 10-2021-0141215 filed on Oct. 21, 2021, in the Republic of Korea, the entire contents of which are hereby expressly incorporated by reference into the present application.

BACKGROUND

Technical Field

The present disclosure relates to a wafer on which a plurality of light emitting diodes (LEDs) are formed, and more particularly, to a wafer having improved uniformity of light emitted from a plurality of LEDs grown on one wafer.

Discussion of the Related Art

Display devices used in computer monitors, TVs, and mobile phones can be organic light emitting displays (OLEDs) that emit light by themselves, or liquid crystal displays (LCDs) that require a separate light source.

Such display devices are being applied to more and more various fields including not only computer monitors and TVs, but also to personal mobile devices As such, display devices having a reduced volume and weight while having a wide display area are being studied.

In recent years, display devices including light emitting diodes (LEDs) have received attention as the next-generation display devices. Since the LED is formed of an inorganic material rather than an organic material, it has excellent reliability and can have a longer lifespan compared to a liquid crystal display or an organic light emitting display.

In addition, the LED has a high lighting speed, a high luminous efficiency and an excellent stability due to high impact resistance and can display a high-brightness image.

SUMMARY OF THE DISCLOSURE

An aspect of the present disclosure is to provide a wafer having a reduced wavelength deviation between a plurality of LEDs.

Another aspect of the present disclosure is to provide a wafer capable of easily compensating for non-uniformity in an indium composition of an epitaxial layer.

Still another aspect of the present disclosure is to provide a wafer capable of easily shifting wavelengths of light emitted from a plurality of LEDs.

Objects of the present disclosure are not limited to the above-mentioned objects, and other objects, which are not mentioned above, can be clearly understood by those skilled in the art from the following descriptions.

A wafer according to an exemplary embodiment of the present disclosure includes a substrate including an active area, and a plurality of LEDs disposed on the active area. Each of the plurality of LEDs includes an emission layer disposed on the substrate, a p-type semiconductor layer disposed on the emission layer, and a p-type electrode disposed on the p-type semiconductor layer. The size of an area of the p-type electrode decreases as the plurality of LEDs are disposed more adjacent to four corners of the active area. Accordingly, by configuring the area of the p-type electrode of each of the plurality of LEDs differently, it is possible to reduce a wavelength deviation between the plurality of LEDs.

A wafer according to another exemplary embodiment of the present disclosure includes a substrate including an active area, a first LED disposed on the active area and including a first p-type electrode, and a second LED disposed on the active area and including a second p-type electrode. A size of the first p-type electrode is smaller than a size of the second p-type electrode. Accordingly, by configuring the sizes of the first p-type electrode of the first LED and the second p-type electrode of the second LED differently, the wavelengths of light emitted from each of the first LED and the second LED can be easily adjusted.

Other detailed matters of the exemplary embodiments are included in the detailed description and the drawings.

According to the present disclosure, a wavelength deviation between a plurality of LEDs grown on one wafer can be reduced.

According to the present disclosure, the wavelengths of light emitted from each of a plurality of LEDs can be easily shifted to a shorter wavelength or a longer wavelength by adjusting the size of the p-type electrode.

According to the present disclosure, even if an indium composition of an epitaxial layer on one wafer is formed non-uniformly, a wavelength deviation according to the indium composition can be easily compensated.

The effects according to the present disclosure are not limited to the contents exemplified above, and more various effects are included in the present specification.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
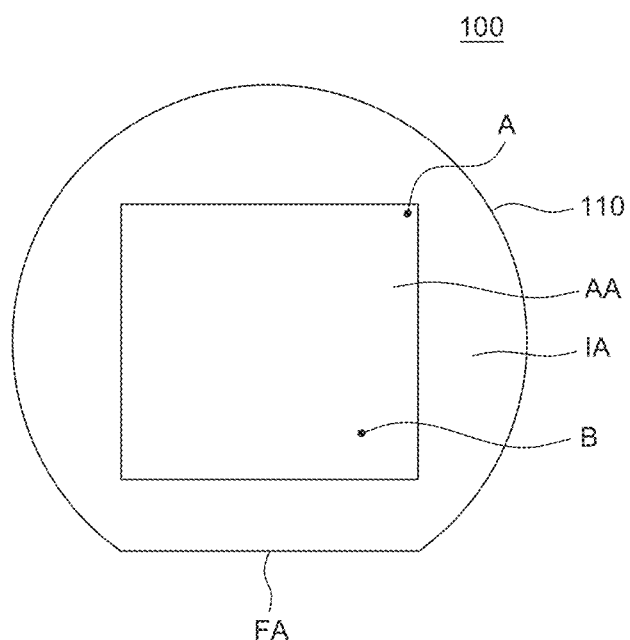
FIG. 1 is a plan view of a wafer according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, the element or layer can be directly on the another element or layer, or one or more layer(s) or element (s) can be interposed therebetween.

Although the terms "first", "second", and the like are used for describing various components, these components are not confined by these terms. These terms are merely used for distinguishing one component from the other components, and may not define order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a wafer according to exemplary embodiments of the present disclosure will be described in detail with reference to accompanying drawings. All the components of each wafer according to all embodiments of the present disclosure are operatively coupled and configured.

FIG. 1 is a plan view of a wafer according to an exemplary embodiment of the present disclosure. Referring to FIG. 1, a wafer 100 according to an exemplary embodiment of the present disclosure includes a substrate 110 and a plurality of LEDs.

The substrate 110 is a component to support various components included in the wafer 100. The substrate 110 is a substrate on which a plurality of LEDs are grown. The substrate 110 can be formed of various materials according to materials constituting the plurality of LEDs. For example, the substrate 110 can be formed of sapphire, gallium nitride (GaN), silicon (Si), silicon carbide (SiC), or the like, but is not limited thereto.

The substrate 110 includes an active area AA and an outer area IA. The active area AA is an area in which a plurality of LEDs are formed, and the outer area IA surrounding the active area AA is an area in which alignment keys or the like are disposed. The active area AA could have a tetragon shape, a rectangle shape or a circular shape, but the embodiments are not limited thereto. For example, the active area AA could have an oval shape, etc.

A flat zone FA is disposed on a portion of an edge of the substrate 110. The flat zone FA is a portion formed of a straight line in the edge of the substrate 110 having a circular shape. The flat zone FA is to distinguish a structure of the wafer 100. A vertical and horizontal of the wafer 100 can be determined using the flat zone FA, and the flat zone FA can be used as a baseline when processing the wafer 100.

The plurality of LEDs are disposed in the active area AA. The plurality of LEDs are semiconductor devices that emit light when a voltage is applied thereto. The LEDs can emit red light, green light, blue light, and the like. For example, the LED can be a blue LED or a green LED, but is not limited thereto. For example, the LEDs can also emit visible light with other colors, or infrared light, etc.

An epitaxial layer is grown by forming a material such as gallium nitride (GaN) or the like constituting the plurality of LEDs on the substrate 110. And the epitaxial layer is cut into individual chips and electrodes are formed thereon, so that the plurality of LEDs can be formed. A detailed description of a process of forming the plurality of LEDs will be described later with reference to FIGS. 5A to 6E.

Hereinafter, the plurality of LEDs will be described in detail with reference to FIGS. 2 to 4.

Figure 2:
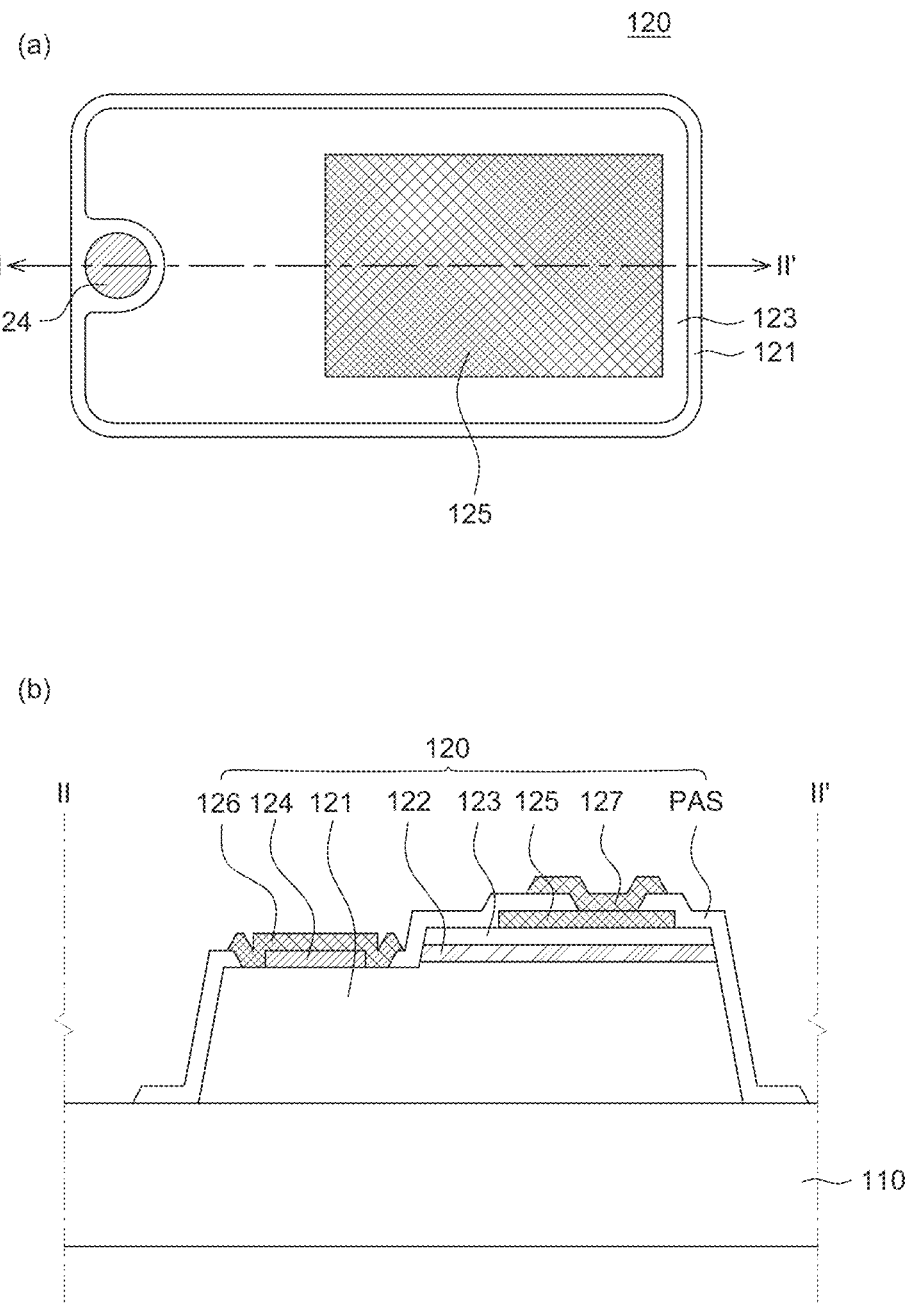
FIGS. 2 and 3 are a plan view and a cross-sectional view of an LED of a wafer according to an exemplary embodiment of the present disclosure.
Figure 3:
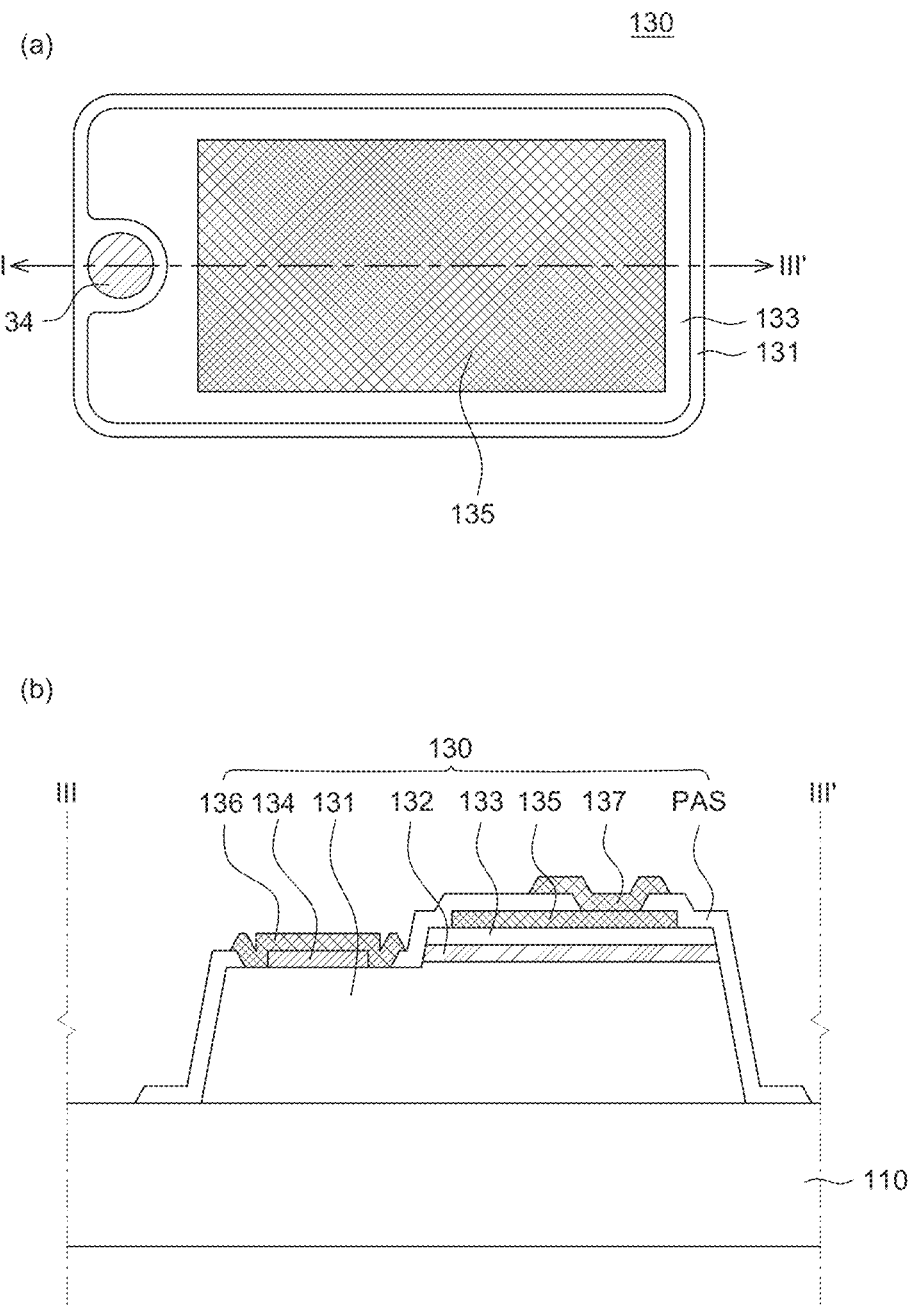

FIGS. 2 and 3 are a plan view and a cross-sectional view of an LED of a wafer according to an exemplary embodiment of the present disclosure. FIG. 4 is a graph showing variations in dominant wavelengths according to current densities. Particularly, (a) and (b) of FIG. 2 are respectively a plan view and a cross-sectional view of a first LED 120 that is located in area A of FIG. 1 among the plurality of LEDs. Further, (a) and (b) of FIG. 3 are respectively a plan view and a cross-sectional view of a second LED 130 that is located in area B among the plurality of LEDs.

For convenience of explanation, only a first n-type semiconductor layer 121, a first p-type semiconductor layer 123, a first n-type electrode 124, and a first p-type electrode 125 are illustrated in (a) of FIG. 2, and only a second n-type semiconductor layer 131, a second p-type semiconductor layer 133, a second n-type electrode 134, and a second p-type electrode 135 are illustrated in (a) of FIG. 3. In addition, for convenience of explanation, in FIGS. 2 and 3, an LED in area A among the plurality of LEDs is referred to as the first LED 120 and an LED in area B among the plurality of LEDs is referred to as the second LED 130, but the present disclosure is not limited thereto.

Referring to FIG. 2, the first LED 120 includes the first n-type semiconductor layer 121, a first emission layer 122, the first p-type semiconductor layer 123, the first n-type electrode 124, the first p-type electrode 125, an insulating layer PAS, a first n-type pad electrode 126, and a first p-type pad electrode 127.

The first n-type semiconductor layer 121 is disposed on the substrate 110, and the first p-type semiconductor layer 123 is disposed on the first n-type semiconductor layer 121. The first n-type semiconductor layer 121 and the first p-type semiconductor layer 123 can be layers formed by doping a specific material with n-type impurities and p-type impurities. The first n-type semiconductor layer 121 can be a layer in which a material such as gallium nitride (GaN) or the like is doped with n-type impurities, and the first p-type semiconductor layer 123 can be a layer in which a material such as gallium nitride (GaN) or the like is doped with p-type impurities. For example, the n-type impurities can be silicon (Si), germanium (Ge), tin (Sn), and the like, and the p-type impurities can be magnesium (Mg), zinc (Zn), beryllium (Be), and the like, but the present disclosure is not limited thereto.

The first emission layer 122 is disposed between the first n-type semiconductor layer 121 and the first p-type semiconductor layer 123. The first emission layer 122 can receive holes and electrons from the first n-type semiconductor layer 121 and the first p-type semiconductor layer 123 to emit light. The first emission layer 122 can have a single-layer or multi-quantum well (MQW) structure, for example, can be formed of gallium nitride (GaN) containing indium (In) or the like, but is not limited thereto.

A portion of the first n-type semiconductor layer 121 protrudes outwardly of the first emission layer 122 and the first p-type semiconductor layer 123. The first emission layer 122 and the first p-type semiconductor layer 123 can have a size smaller than that of the first n-type semiconductor layer 121 to expose an upper surface of the first n-type semiconductor layer 121. A portion of the first n-type semiconductor layer 121 can be exposed from the first emission layer 122 and the first p-type semiconductor layer 123 to be electrically connected to the first n-type electrode 124. In this case, an entirety of the first emission layer 122 and an entirety of the first p-type semiconductor layer 123 can overlap a portion of the first n-type semiconductor layer 121.

The first n-type electrode 124 is disposed on the first n-type semiconductor layer 121, and the first p-type electrode 125 is disposed on the first p-type semiconductor layer 123. The first n-type electrode 124 can be in contact with the upper surface of the first n-type semiconductor layer 121 that is exposed from the first emission layer 122 and electrically connected to the first n-type semiconductor layer 121. The first p-type electrode 125 can be in contact with an upper surface of the first p-type semiconductor layer 123 and electrically connected to the first p-type semiconductor layer 123.

Meanwhile, the first n-type electrode 124 and the first p-type electrode 125 can be formed of a transparent conductive material, for example, tin oxide (TO), indium tin oxide (ITO), indium zinc oxide (IZO), indium tin zinc oxide (ITZO), or the like. In addition, even if the first n-type electrode 124 is formed of an opaque conductive material, it does not overlap the first emission layer 122, and thus may not interfere with a progress of light emitted from the first emission layer 122. Accordingly, the first n-type electrode 124 can be formed of an opaque conductive material, for example, a material such as gold (Au).

Next, the insulating layer PAS surrounding at least a portion of the first LED 120 is disposed. In order to prevent an electrical short between the first n-type semiconductor layer 121 and the first p-type semiconductor layer 123 that are connected to different electrodes of the first LED 120, the insulating layer PAS can be disposed to surround a portion of the first LED 120. Specifically, the insulating layer PAS can cover an entirety of a side surface and a portion of the upper surface of the first n-type semiconductor layer 121, an entirety of a side surface of the first emission layer 122, an entirety of a side surface and a portion of the upper surface of the first p-type semiconductor layer 123, the first n-type electrode 124, and the first p-type electrode 125.

Contact holes that expose the first n-type electrode 124 and the first p-type electrode 125 are formed in the insulating layer PAS, and the first n-type pad electrode 126 and the first p-type pad electrode 127 are formed on the contact holes. When the first LED 120 is transferred to a display device or the like, the first LED 120 and a wiring can be connected through the first n-type pad electrode 126 and the first p-type pad electrode 127.

However, a structure of the first LED 120 illustrated in FIG. 2 is exemplary, and the insulating layer PAS or the first n-type pad electrode 126 and the first p-type pad electrode 127 could be omitted, or shapes of the first n-type semiconductor layer 121, the first emission layer 122, and the first p-type semiconductor layer 123 can be varied, and positions of the first n-type electrode 124 and the first p-type electrode 125 can be varied. Accordingly, the structure of the first LED 120 is not limited to that illustrated in the drawings.

Referring to FIG. 3, the second LED 130 among the plurality of LEDs includes the second n-type semiconductor layer 131, a second emission layer 132, the second p-type semiconductor layer 133, the second n-type electrode 134, the second p-type electrode 135, an insulating layer PAS, a second n-type pad electrode 136, and a second p-type pad electrode 137.

The second n-type semiconductor layer 131, the second emission layer 132, the second p-type semiconductor layer 133, the second n-type electrode 134, the second p-type electrode 135, the insulating layer PAS, the second n-type pad electrode 136, and the second p-type pad electrode 137 of the second LED 130 are substantially the same configurations of the first n-type semiconductor layer 121, the first emission layer 122, the first p-type semiconductor layer 123, the first n-type electrode 124, the first p-type electrode 125, the insulating layer PAS, the first n-type pad electrode 126, and the first p-type pad electrode 127 of the first LED 120, respectively.

Meanwhile, by configuring a size of the first p-type electrode 125 to be smaller than a size of the second p-type electrode 135, a current density of a current that is injected into the first p-type electrode 125 can be increased. First, the first p-type electrode 125 of the first LED 120 has a size smaller than that of the second p-type electrode 135 of the second LED 130. For example, an area of the first p-type electrode 125 can be smaller than an area of the second p-type electrode 135. In this case, if the same current is applied to the first p-type electrode 125 and the second p-type electrode 135, a current density in the first p-type electrode 125 can be higher than a current density in the second p-type electrode 135.

Figure 4:
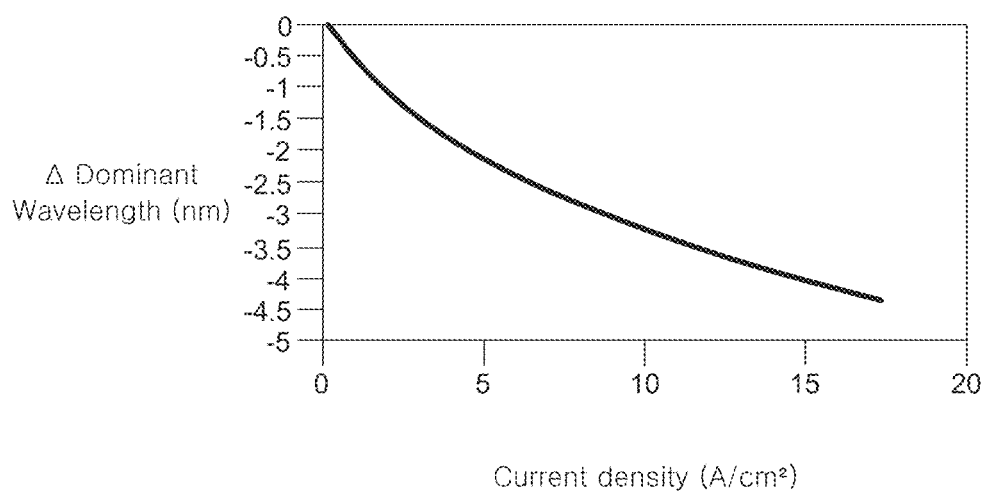
FIG. 4 is a graph showing variations in dominant wavelengths according to current densities.

Referring to FIG. 4, when a current density of a current that is injected into the first emission layer 122 and the second emission layer 132 increases, light emitted from the first emission layer 122 and the second emission layer 132 can be shifted toward a short wavelength. As the current density increases, it can be seen that a variation in dominant wavelength of the light emitted from the first emission layer 122 and the second emission layer 132 decreases to a negative value, for example, it is shifted to a short wavelength. If the same current is applied to the first p-type electrode 125 and the second p-type electrode 135, the current density increases in the first p-type electrode 125 having a relatively small size with respect to that in the second p-type electrode 135 having a relatively large size, and thus, light emitted from the first emission layer 122 can have a shorter wavelength than that of light emitted from the second emission layer 132.

Meanwhile, the first emission layer 122 and the second emission layer 132 include indium. However, indium compositions of the first emission layer 122 and the second emission layer 132 can be different. The first emission layer 122 of the first LED 120 disposed closer to one of a plurality of corners of the active area AA than the second LED 130 can contain more indium than the second emission layer 132 of the second LED 130. The indium compositions of the first emission layer 122 and the second emission layer 132 can vary according to temperature when the first emission layer 122 and the second emission layer 132 are formed, which will be described later with reference to FIGS. 5A to 5E.

In this case, wavelengths of light emitted from each of the first emission layer 122 and the second emission layer 132 can vary according to the indium compositions. The more indium there is, the longer wavelength of light can be emitted, and the less the indium there is, the shorter wavelength of light can be emitted. If conditions such as the current density and the amount of a current that is supplied to the first emission layer 122 and the second emission layer 132 are the same, the light emitted from the first emission layer 122 containing more indium can have a longer wavelength than the light emitted from the second emission layer 132. Accordingly, since the first emission layer 122 contains more indium than the second emission layer 132, the first emission layer 122 can emit light having a longer wavelength than that of the second emission layer 132 under the same conditions.

Meanwhile, even in a plurality of LEDs formed on one substrate 110, indium compositions of emission layers can vary according to temperature. In a process of forming the plurality of LEDs on the substrate 110, an entirety of the substrate 110 is not heated at a uniform temperature, and a temperature deviation can occur. Therefore, when the temperature of the substrate 110 is non-uniform, the indium compositions of the emission layers can be formed non-uniformly, and a deviation in wavelength of light emitted from the plurality of LEDs on one substrate 110 can occur. Accordingly, in the wafer 100 according to an exemplary embodiment of the present disclosure, by controlling the size and current density of the p-type electrode in consideration of the wavelength deviation between the plurality of LEDs, it is possible to reduce the deviation in wavelength of light emitted from the plurality of LEDs.

Hereinafter, a method of manufacturing a plurality of LEDs according to an exemplary embodiment of the present disclosure will be described with reference to FIGS. 5A to 6E.

Figure 5A:
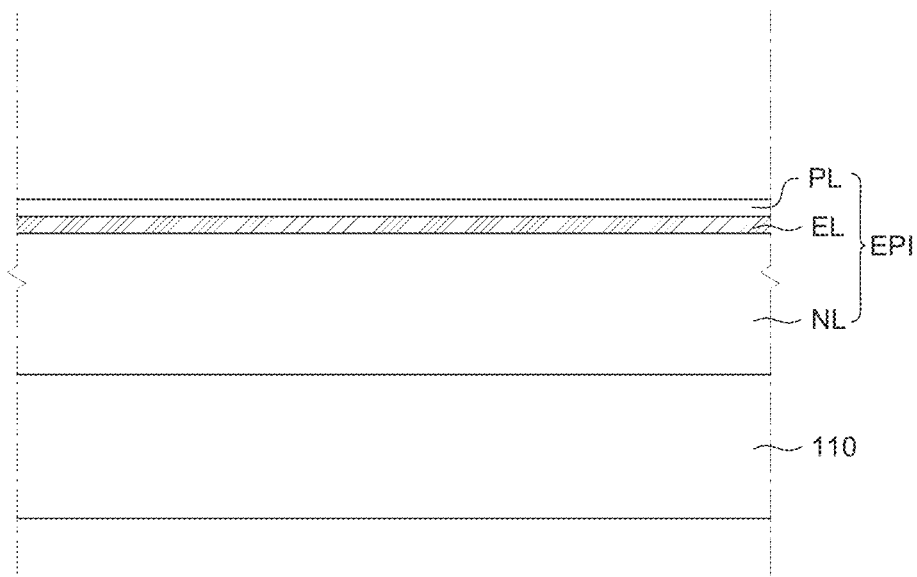
FIGS. 5A to 5E are process views for explaining a process of forming an epitaxial layer of a wafer according to an exemplary embodiment of the present disclosure.
Figure 5B:
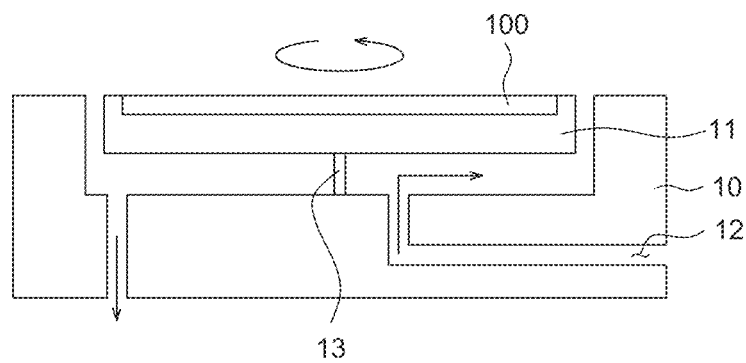
Figure 5C:
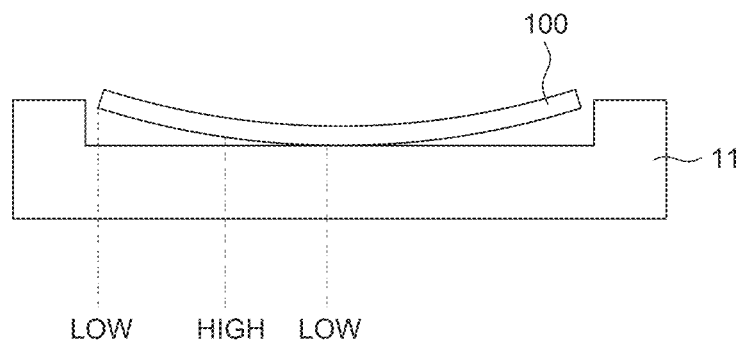
Figure 5D:
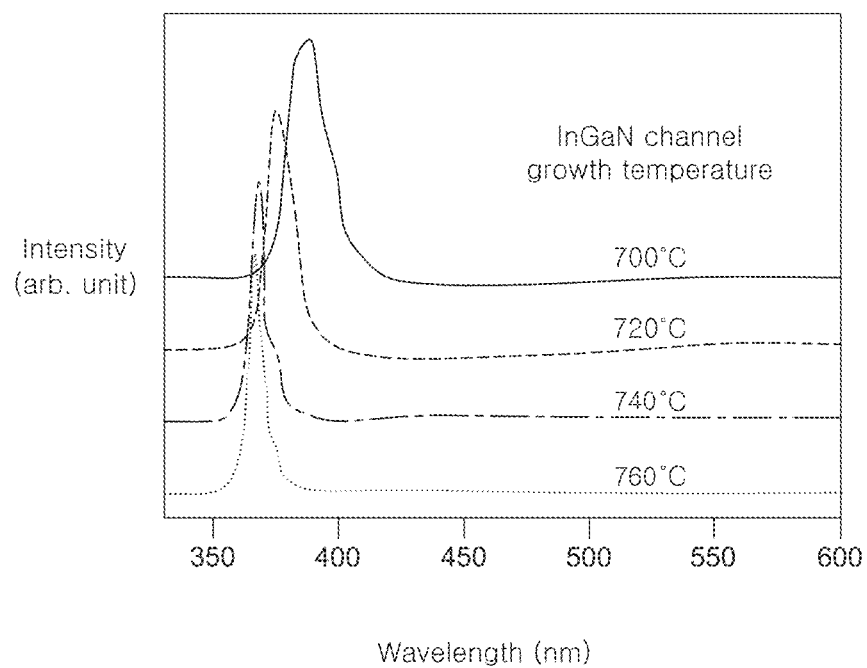
Figure 5E:
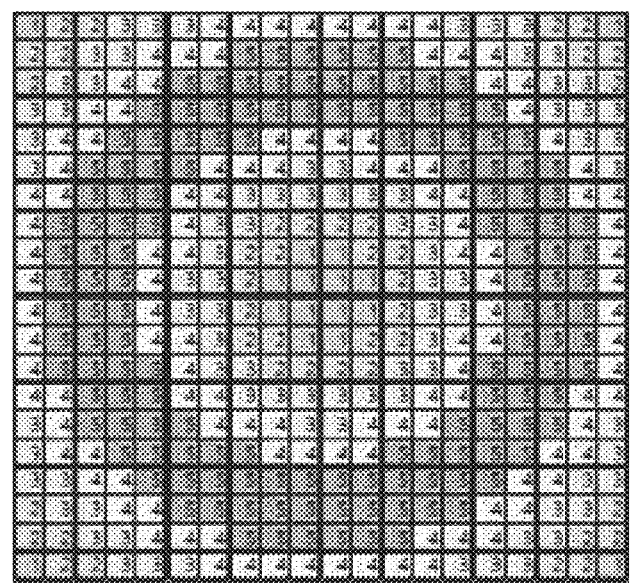

FIGS. 5A to 5E are process views for explaining a process of forming an epitaxial layer of a wafer according to an exemplary embodiment of the present disclosure. Specifically, FIGS. 5A to 5C are schematic process views for explaining a process of forming an epitaxial layer EPI. FIG. 5D is a graph for explaining wavelengths of light according to temperature. FIG. 5E is a schematic plan view for explaining a wavelength deviation between the plurality of LEDs on the substrate 110. Colors illustrated in FIG. 5E indicate whether light emitted from an LED in a corresponding area has a long wavelength or a short wavelength and mean that as closer to lighter area, the LED in the corresponding area emits light of a longer wavelength, and as closer to darker area, the LED in the corresponding area emits light of a shorter wavelength. Further, numbers described in FIG. 5E indicate whether light emitted from an LED in a corresponding area has a long wavelength or a short wavelength and mean that as a closer to 1, the LED in the corresponding area emits light of a longer wavelength, and as closer to 5, the LED in the corresponding area emits light of a shorter wavelength.

Referring to FIG. 5A, an epitaxial layer EPI is formed on the substrate 110. The epitaxial layer EPI is to form a plurality of LEDs and includes an n-type semiconductor material layer NL, an emission material layer EL, and a p-type semiconductor material layer PL. The n-type semiconductor material layer NL is a layer to form the first n-type semiconductor layer 121 and the second n-type semiconductor layer 131, the emission material layer EL is a layer to form the first emission layer 122 and the second emission layer 132, and the p-type semiconductor material layer PL is a layer to form the first p-type semiconductor layer 123 and the second p-type semiconductor layer 133.

First, the n-type semiconductor material layer NL can be formed by growing a semiconductor crystal on the substrate 110. Subsequently, the semiconductor crystal can be grown on the n-type semiconductor material layer NL to thereby form the emission material layer EL and the p-type semiconductor material layer PL. In this case, the emission material layer EL can be grown by inheriting crystallinity of the n-type semiconductor material layer NL, and the p-type semiconductor material layer PL grown on the emission material layer EL can be grown by inheriting crystallinity of the emission material layer EL. Accordingly, the epitaxial layer EPI can be formed by sequentially growing the n-type semiconductor material layer NL, the emission material layer EL, and the p-type semiconductor material layer PL on the substrate 110.

In this case, the epitaxial layer EPI can be grown on the substrate 110 by a method such as metal organic chemical vapor deposition (MOCVD) or sputtering.

For example, referring to FIG. 5B, when the epitaxial layer EPI is formed by the metal organic chemical vapor deposition (MOCVD), the epitaxial layer EPI can be formed by placing the wafer 100 in a deposition film device 10 inside a chamber. For example, after the wafer 100 is mounted on a support substrate 11 inside the chamber, the wafer 100 can be heated to a reaction temperature, and a reaction gas for growing the epitaxial layer EPI can be supplied. Accordingly, the reaction gas which is introduced into the wafer 100 can form a nitride thin film on a surface of the wafer 100 through a chemical vapor deposition reaction, and the epitaxial layer EPI can be formed on the wafer 100.

In this case, a uniform film can be formed on the wafer 100 by rotating the support substrate 11 on which the wafer 100 is mounted during a process. For example, the deposition film device 10 includes a flow path 12 through which gas is supplied and discharged and a rotational shaft 13 which supports the support substrate 11, and can rotate the wafer 100 in a gas-foil manner. The support substrate 11 and the wafer 100 that are connected to the rotational shaft 13 can be rotated by gas supplied through the flow path 12.

Meanwhile, when the entirety of the wafer 100 is heated at a uniform temperature, the epitaxial layer EPI formed on the wafer 100 can also have a uniform quality. However, the wafer 100 can be bent due to a difference in lattice size and a difference in temperature of materials formed on the wafer 100, and a temperature deviation can occur in the active area AA.

For example, referring to FIG. 5C, a central region of the active area AA has high thermal conductivity, but can have a relatively lower temperature than those of other portions of the active area AA since gas that is introduced to rotate the wafer 100 can lower temperature of the central region. In addition, edge portions such as the plurality of corners of the active area AA can be most spaced apart from the support substrate 11 due to the bending of the wafer 100 and have a relatively low temperature. On the other hand, a region between the central region and edges of the active area AA can be disposed adjacent to the support substrate 11 and have a relatively high temperature. Accordingly, a temperature deviation can occur in the active area AA of the wafer 100 during a process.

Meanwhile, referring to FIG. 5D and Table 1 together, an indium composition of the emission material layer EL of the epitaxial layer EPI can vary due to a temperature deviation of the active area AA. For example, as temperature decreases, indium in the emission material layer EL can increase, and as temperature increases, indium in the emission material layer EL can decrease.

For example, referring to Table 1, as a result of analyzing the emission material layer EL of the epitaxial layer EPI grown at a temperature of about 700° C. by an HRXRD method, it can be seen that indium occupies about 4.86%, and as a result of analyzing the emission material layer EL of the epitaxial layer EPI grown at a temperature of about 700° C. by a PL method, it can be seen that indium occupies about 4.67%. For example, as a result of analyzing the emission material layer EL of the epitaxial layer EPI grown at a temperature of about 760° C. by the HRXRD method, it can be seen that indium occupies about 1.24%, and as a result of analyzing the emission material layer EL of the epitaxial layer EPI grown at a temperature of about 760° C. by the PL method, it can be seen that indium occupies about 0.97%. Therefore, it can be seen that an indium content of the emission material layer EL decreases as a process temperature increases.

TABLE 1

| T (° C.) | In (%) | |
| --- | --- | --- |
| | By HRXRD | By PL |
| 700 | 4.86 | 4.67 |
| 720 | 3.12 | 2.93 |
| 740 | 2.49 | 2.05 |
| 760 | 1.24 | 0.97 |

Further, referring to FIG. 5D, it can be seen that the epitaxial layer EPI grown at a higher temperature emits light having a shorter wavelength. For example, in the case of the epitaxial layer EPI grown at 700° C., light having a peak wavelength of about 380 nm can be emitted, and the epitaxial layer EPI grown at 740° C. can emit light having a peak wavelength of about 360 nm. Accordingly, as a growth temperature of the epitaxial layer EPI increases, the indium content can decrease, and light having a shorter wavelength can be emitted. Conversely, as the growth temperature of the epitaxial layer EPI decreases, the indium content increases, and light having a longer wavelength can be emitted.

Therefore, if epitaxial layers EPI are formed under temperature conditions as illustrated in FIG. 5C, they can have wavelength distribution of FIG. 5E. The emission material layers EL formed in the central region and edge regions of the active area AA having a relatively low temperature can contain a large amount of indium and emit light having a long wavelength. In addition, the emission material layers EL formed in a region between the central region and the edge regions of the active area AA having a relatively high temperature can contain a small amount of indium and emit light having a short wavelength. Indium in the emission material layer EL can increase as it is adjacent to a center of the active area AA, and similarly, indium in the emission material layer EL can increase as it is adjacent to the plurality of corners of the active area AA. Conversely, indium in the emission material layer EL can decrease as it is adjacent to an intermediate area between the center and the edges of the active area AA.

In this case, it can be seen that wavelength variations in the active area AA having a rectangular shape change in a circular shape with respect to the central region. For example, areas of the same radius from the central region of the active area AA can have the same or substantially similar indium compositions and wavelength distributions. For example, when the epitaxial layer EPI is formed by the metal organic chemical vapor deposition (MOCVD), a wavelength distribution of the plurality of LEDs can be formed in a symmetrical form with respect to the center of the active area AA. Therefore, the p-type electrodes of the plurality of LEDs can also be formed symmetrically with respect to the center of the active area AA.

However, a process method described in FIGS. 5A to 5E, a temperature distribution of the wafer 100 and a wavelength distribution of the epitaxial layer EPI are exemplary, and the temperature distribution can vary depending on the process method or process conditions and the like, but is not limited thereto.

Therefore, the epitaxial layer EPI formed on one wafer 100 may not emit light of the same color, but can have a wavelength deviation for each area due to a temperature deviation during a process. Accordingly, when a plurality of LEDs formed on one wafer 100 are transferred to a single display device, display quality of an image can be degraded due to a wavelength deviation between the plurality of LEDs. Accordingly, in the wafer 100 according to an exemplary embodiment of the present disclosure, this wavelength deviation can be alleviated by configuring the sizes of the p-type electrodes of each of the plurality of LEDs to be different from each other.

Hereinafter, a process of forming the plurality of LEDs from the epitaxial layer EPI will be described with reference to FIGS. 6A to 6E.

FIGS. 6A to 6E are process views for explaining a process of forming a plurality of LEDs of a wafer according to an exemplary embodiment of the present disclosure. FIGS. 6A to 6E are process views for explaining a process of forming the first LED 120 among the plurality of LEDs of the wafer 100 according to an exemplary embodiment of the present disclosure.

Figure 6A:
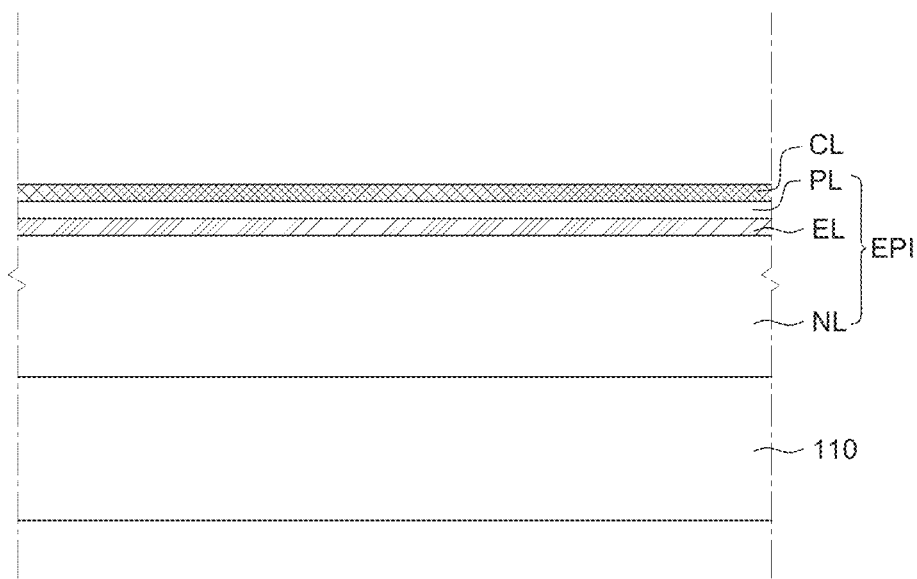
FIGS. 6A to 6E are process views for explaining a process of forming a plurality of LEDs of a wafer according to an exemplary embodiment of the present disclosure.

Referring to FIG. 6A, a conductive layer CL is formed on the epitaxial layer EPI. The conductive layer CL is a conductive layer for forming the first p-type electrode 125 and can be formed of the same material as the first p-type electrode 125. For example, the conductive layer CL can be formed of a transparent conductive material, for example, tin oxide (TO), indium tin oxide (ITO), indium zinc oxide (IZO), indium tin zinc oxide (ITZO), or the like.

Figure 6B:
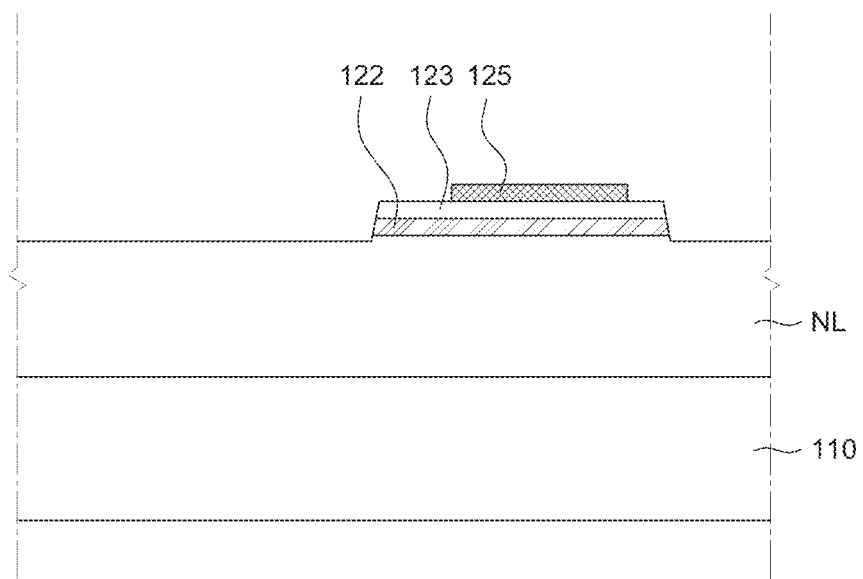

Referring to FIG. 6B, by patterning the epitaxial layer EPI, the first emission layer 122 and the first p-type semiconductor layer 123 are formed, and the first p-type electrode 125 is formed.

First, the first p-type electrode 125 can be formed by patterning the conductive layer CL. In this case, the conductive layer CL can be patterned into the first p-type electrode 125 having various sizes according to a wavelength distribution on the wafer 100. For example, in an area where the epitaxial layer EPI is formed at a relatively low temperature, an indium content of the epitaxial layer EPI can increase and emit light of a long wavelength. In this case, as described with reference to FIG. 4, by configuring the size of the first p-type electrode 125 to be relatively small, a current density of a current injected into the first p-type electrode 125 can be increased, and light emitted from the first emission layer 122 can be shifted toward a shorter wavelength.

For example, in the edge regions and the central region where the epitaxial layer EPI is formed at a relatively low temperature, the first p-type electrode 125 having a relatively small size like the first LED 120 of FIG. 2 can be formed, and light emitted from the first emission layer 122 corresponding to the first p-type electrode 125 can be shifted toward a shorter wavelength. For example, as the areas of the p-type electrodes of the plurality of LEDs are decreased as they are adjacent to the edge regions and the central region of the active area AA, a current density in the p-type electrode can be increased, and the light emitted from the emission layer can be shifted to a shorter wavelength.

For example, in an area in which the epitaxial layer EPI is formed at a relatively high temperature, the indium content of the epitaxial layer EPI can decrease and emit light having a short wavelength. Accordingly, in the area where the epitaxial layer EPI is formed at a relatively high temperature, for example, in the intermediate area between the plurality of corners and the center of the active area AA, the second p-type electrode 135 having a relatively large size like the second LED 130 of FIG. 3 can be formed, and light emitted from the second emission layer 132 corresponding to the second p-type electrode 135 can be maintained or shifted toward a longer wavelength. For example, the area of the p-type electrode increases as it is adjacent to the intermediate area between the plurality of corners and the central region of the active area AA to thereby lower the current density, and the light emitted from the emission layer can be shifted toward a longer wavelength. Accordingly, the size of the p-type electrode of each of the plurality of LEDs can be differently formed in consideration of a formation temperature and the indium composition of the epitaxial layer EPI.

Next, the first p-type semiconductor layer 123 and the first emission layer 122 of each of the first LEDs 120 can be formed by patterning the p-type semiconductor material layer PL and the emission material layer EL of the epitaxial layer EPI exposed from the first p-type electrode 125. The first p-type semiconductor layer 123 and the first emission layer 122 can be formed by patterning an upper portion of the epitaxial layer EPI exposed from the first p-type electrode 125.

Figure 6C:
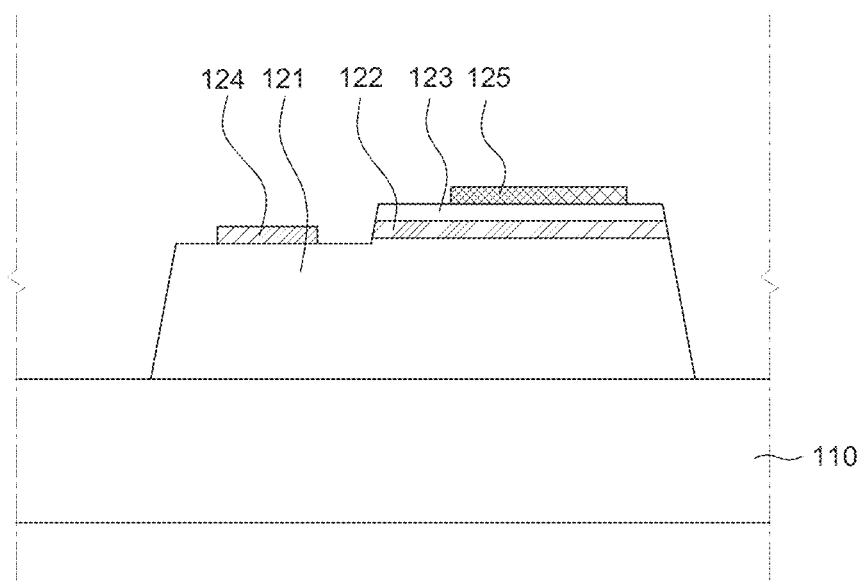

Referring to FIG. 6C, the first n-type electrode 124 and the first n-type semiconductor layer 121 of each of the first LEDs 120 are formed. The first n-type electrode 124 can be formed on the n-type semiconductor material layer NL exposed by patterning the p-type semiconductor material layer PL and the emission material layer EL. The first n-type electrode 124 can be formed of a transparent conductive material, for example, tin oxide (TO), indium tin oxide (ITO), indium zinc oxide (IZO), or indium tin zinc oxide (ITZO), or can be formed of a conductive material such as gold (Au).

In addition, the first n-type semiconductor layer 121 of the first LED 120 can be formed by patterning the n-type semiconductor material layer NL. Accordingly, formation of the first n-type semiconductor layer 121, the first emission layer 122, the first p-type semiconductor layer 123, the first n-type electrode 124, and the first p-type electrode 125 of each of the first LEDs 120 can be completed. However, a formation order of the first n-type semiconductor layer 121 and the first n-type electrode 124 can vary, and is not limited thereto.

Figure 6D:
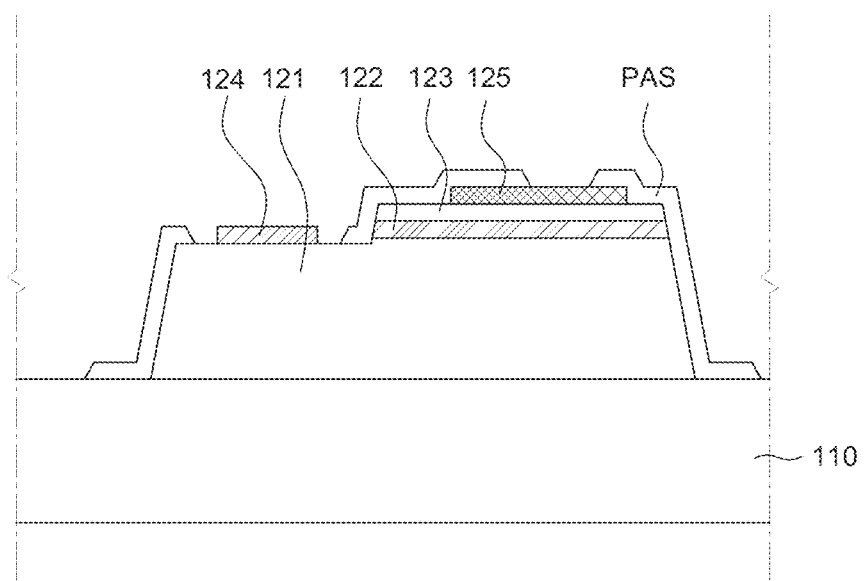

Referring to FIG. 6D, the insulating layer PAS that covers the first n-type semiconductor layer 121, the first emission layer 122, the first p-type semiconductor layer 123, the first n-type electrode 124, and the first p-type electrode 125 is formed. By forming an insulating material on the wafer 100, the insulating layer PAS covering a side surface and an upper surface of the first n-type semiconductor layer 121, a side surface of the first emission layer 122, a side surface and an upper surface of the first p-type semiconductor layer 123, the first n-type electrode 124, and the first p-type electrode 125 can be formed, and then contact holes exposing the first n-type electrode 124 and the first p-type electrode 125 are formed in the insulating layer PAS.

Figure 6E:
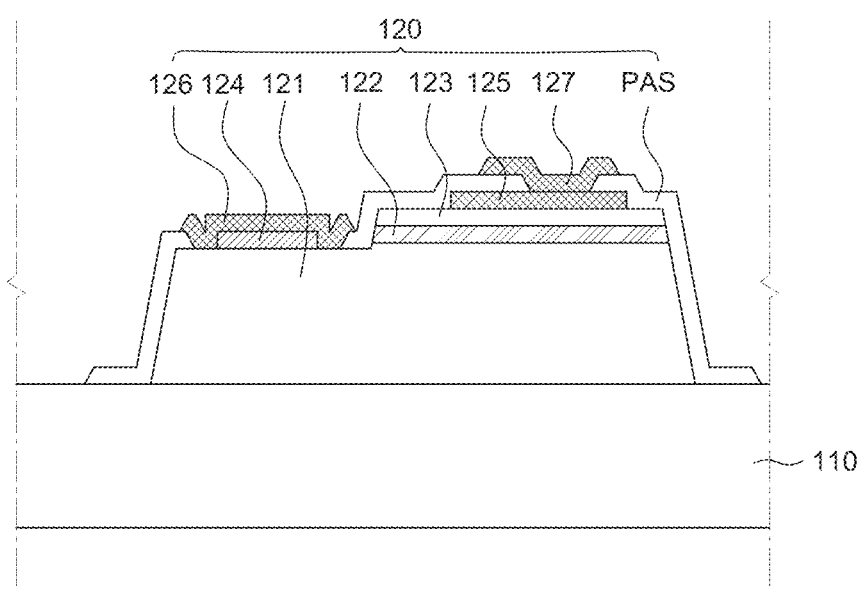

Finally, referring to FIG. 6E, the first n-type pad electrode 126 and the first p-type pad electrode 127 are formed. Accordingly, the first LED 120 including the first n-type semiconductor layer 121, the first emission layer 122, the first p-type semiconductor layer 123, the first n-type electrode 124, the first p-type electrode 125, the insulating layer PAS, the first n-type pad electrode 126, and the first p-type pad electrode 127 can be formed.

Hereinafter, effects of the present disclosure will be described with reference to FIGS. 7 and 8.

Figure 7:
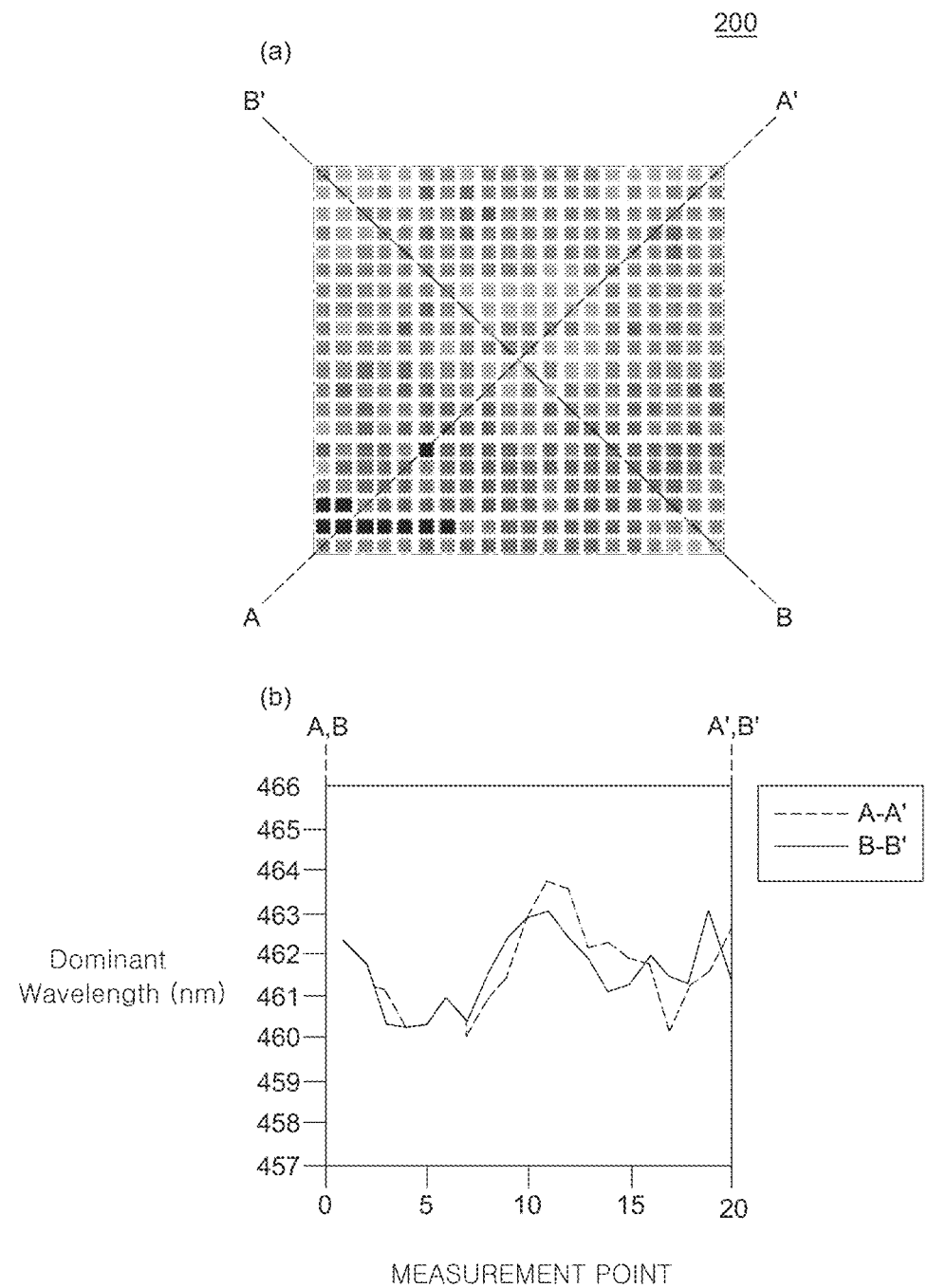
FIG. 7 is a diagram illustrating a wavelength distribution of a plurality of LEDs of a wafer according to a comparative example.

FIG. 7 is a diagram illustrating a wavelength distribution of a plurality of LEDs of a wafer according to a comparative example. FIG. 8 is a diagram illustrating a wavelength distribution of a plurality of LEDs of a wafer according to an exemplary embodiment of the present disclosure.

More specifically, (a) of FIG. 7 is a plan view showing a wavelength distribution of a plurality of LEDs of a wafer 200 according to the comparative example, and (b) of FIG. 7 is a graph showing the wavelength distribution of the LEDs along lines A-A' and B-B'. Further, (a) of FIG. 8 is a plan view showing a wavelength distribution of a plurality of LEDs of the wafer 100 according to an embodiment of the present disclosure, and (b) of FIG. 8 is a graph showing the wavelength distribution of the LEDs along lines A-A' and B-B'. Horizontal axes of (b) of FIG. 7 and (b) of FIG. 8 indicate measurement points along lines A-A' and B-B', and vertical axes of (b) of FIG. 7 and (b) of FIG. 8 indicate dominant wavelengths (nm).

The plurality of LEDs of the wafer 200 according to the comparative example are configured so that sizes of p-type electrodes are all identical to each other. The plurality of LEDs of the wafer 100 according to the embodiment of the present disclosure are substantially the same as the plurality of LEDs of FIGS. 1 to 6E, and as the indium content of the emission layer increases, the size of the p-type electrode can be reduced.

Referring to FIG. 7, as a result of measuring the dominant wavelengths of the plurality of LEDs disposed along lines A-A' and B-B' in the wafer 200 according to the comparative example, it can be seen that the dominant wavelengths of the LEDs are relatively high in the plurality of corners and a central region of an active area AA, and the dominant wavelengths of the LEDs are relatively low in a region between the plurality of corners and the central region. For example, at measurement points of 0 and 20 corresponding to the four corners of the active area AA, the dominant wavelength has a value of about 462 nm, and at measurement point of 10 corresponding to the central region of the active area AA, the dominant wavelength can have a value of about 463 nm.

In addition, the dominant wavelength can have a value of about 460 nm at measurement points of 5 and 15 corresponding to the region between the four corners and the central region of the active area AA. Accordingly, the plurality of LEDs of the wafer 200 according to the comparative example can have a wavelength deviation of about 3.6 nm.

Figure 8:
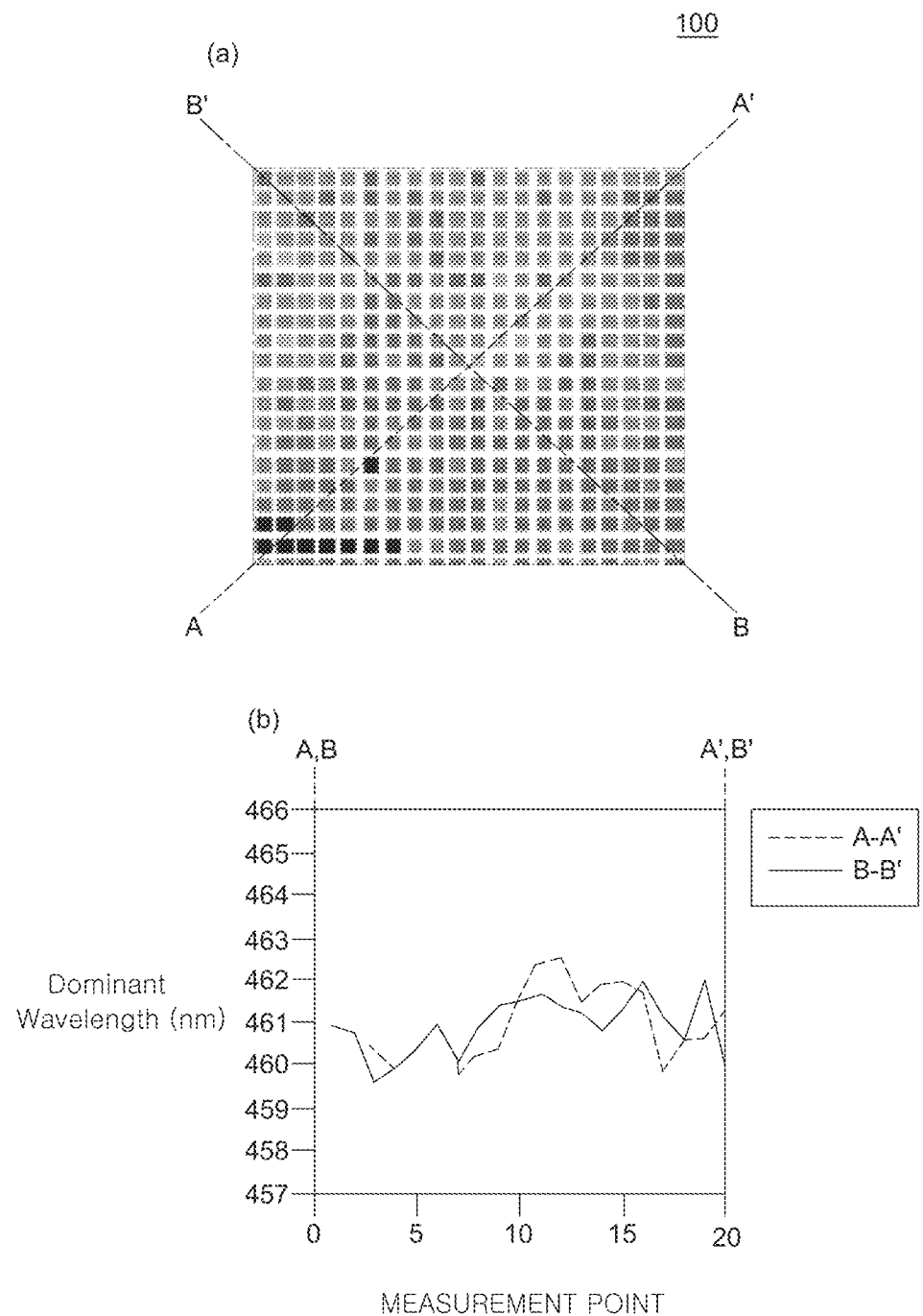
FIG. 8 is a diagram illustrating a wavelength distribution of a plurality of LEDs of a wafer according to an exemplary embodiment of the present disclosure.

Referring to FIG. 8, as a result of measuring the dominant wavelengths of the plurality of LEDs disposed along lines A-A' and B-B' in the wafer 100 according to the embodiment of the present disclosure, it can be seen that a wavelength distribution of the active area AA is uniform overall. For example, the dominant wavelength has a value of about 461 nm at measurement points of 0 and 20 corresponding to four corners of the active area AA, and the dominant wavelength can have a value of about 462 nm at measurement point of 10 corresponding to a central region of the active area AA. In addition, the dominant wavelength can have a value of about 461 nm at measurement points of 5 and 15 corresponding to a region between the four corners and the central region of the active area AA. Accordingly, the plurality of LEDs of the wafer 100 according to the embodiment of the present disclosure can have a wavelength deviation of about 2.3 nm.

In summary, the wafer 200 according to the comparative example in which the p-type electrodes of the plurality of LEDs are formed to have the same size can have a wavelength deviation of about 3.6 nm. In addition, the wafer 100 according to the embodiment of the present disclosure in which the sizes of the p-type electrodes are formed differently according to indium compositions of each of the plurality of LEDs can have a wavelength deviation of about 2.3 nm. Therefore, in the wafer 100 according to the embodiment of the present disclosure, the p-type electrodes of the plurality of LEDs are configured to have different sizes in consideration of a wavelength deviation of an epitaxial layer EPI, and thus, compared to the wafer 200 according to the comparative example, it is possible to reduce the wavelength deviation of the plurality of LEDs.

Accordingly, in the wafer 100 according to an exemplary embodiment of the present disclosure, the size of the p-type electrode can be formed differently in consideration of the growth temperature and indium content of the epitaxial layer EPI, and a plurality of LEDs having a uniform wavelength distribution can be formed on one wafer 100. When the epitaxial layer EPI is formed, the indium composition of the emission material layer EL can vary according to temperature. For example, as temperature increases, indium in the emission material layer EL can decrease, and as temperature decreases, indium in the emission material layer EL can increase.

In addition, as the indium content of the emission material layer EL decreases, light emitted from the LED can be shifted toward a shorter wavelength, and as the indium content of the emission material layer EL increases, light emitted from the LED can be shifted toward a longer wavelength.

On the other hand, depending on bending of the wafer 100 or process conditions, and the like, in the active area AA in which the epitaxial layer EPI is formed, a temperature deviation can occur, and a wavelength deviation between a plurality of LEDs formed on one wafer 100 can occur.

However, deviation in wavelength of light emitted from the plurality of LEDs can be reduced by adjusting the current density by forming different sizes of the p-type electrodes of each of the plurality of LEDs. Specifically, when the current density is increased by reducing the size of the p-type electrode, light emitted from the LED can be shifted toward a shorter wavelength. Conversely, when the current density is reduced by increasing the size of the p-type electrode, light emitted from the LED can be shifted toward a longer wavelength. Accordingly, since an LED in an area having a lower temperature in the active area AA emits light that is shifted to a longer wavelength compared to other LEDs, light emitted from the LED can be shifted to a shorter wavelength by forming a p-type electrode having a relatively small size in the corresponding LED.

Therefore, in the wafer 100 according to an exemplary embodiment of the present disclosure, the size of the p-type electrode of each of the plurality of LEDs can be formed differently in consideration of a wavelength deviation between the plurality of LEDs and a temperature deviation in the active area AA, and a wavelength deviation between a plurality of LEDs formed on one wafer 100 can be reduced.

The exemplary embodiments of the present disclosure can also be described as follows:

According to an aspect of the present disclosure, there is provided a wafer. The wafer includes a substrate including an active area, and a plurality of LEDs disposed on the active area. Each of the plurality of LEDs includes an emission layer disposed on the substrate, a p-type semiconductor layer disposed on the emission layer, and a p-type electrode disposed on the p-type semiconductor layer. The size of an area of the p-type electrode decreases as the plurality of LEDs are disposed more adjacent to a plurality of corners of the active area.

In the plurality of LEDs, the area of the p-type electrode can decrease as it is disposed more adjacent to a center of the active area. The area of the p-type electrode can increase as the plurality of LEDs are disposed more adjacent to an intermediate area between the center of the active area and the plurality of corners of the active area.

The emission layer can include indium. An indium composition of the emission layer can increase as the plurality of LEDs are disposed more adjacent to the plurality of corners of the active area.

The indium composition of the emission layer can increase as the plurality of LEDs are disposed more adjacent to a center of the active area.

The indium composition of the emission layer can decrease as the plurality of LEDs are disposed more adjacent to an intermediate area between the center of the active area and the plurality of corners of the active area.

The area of the p-type electrode can decrease as the indium composition of the emission layer increases.

According to another aspect of the present disclosure, there is provided a wafer. The wafer includes a substrate including an active area, a first LED disposed on the active area and including a first p-type electrode, and a second LED disposed on the active area and including a second p-type electrode. A size of the first p-type electrode is smaller than a size of the second p-type electrode.

The first LED can further include a first emission layer, and the second LED can further include a second emission layer. The first emission layer can include more indium than the second emission layer.

When current densities of currents supplied to the first emission layer and the second emission layer are the same, the first emission layer can emit light having a longer wavelength than that of the second emission layer.

The first emission layer and the second emission layer can be one of a green emission layer or a blue emission layer.

The first LED can be disposed more adjacent to a plurality of corners of the active area than the second LED.

The first LED can be disposed more adjacent to a center of the active area than the second LED.

Although the exemplary embodiments of the present disclosure have been described in detail with reference to the accompanying drawings, the present disclosure is not limited thereto and can be embodied in many different forms without departing from the technical concept of the present disclosure.

Therefore, the exemplary embodiments of the present disclosure are provided for illustrative purposes only but not intended to limit the technical concept of the present disclosure. The scope of the technical concept of the present disclosure is not limited thereto.

Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A wafer, comprising:
a substrate including an active area; and
a plurality of light emitting diodes (LEDs) disposed on the active area,
wherein each of the plurality of LEDs includes:
an emission layer disposed on the substrate;
a p-type semiconductor layer disposed on the emission layer; and
a p-type electrode disposed on the p-type semiconductor layer, and
wherein a size of an area of the p-type electrode in one LED is different from a size of an area of the p-type electrode in another LED among the plurality of LEDs, and
wherein the emission layer includes indium and the area of the p-type electrode decreases as an indium composition of the emission layer increases.

2. The wafer of claim 1, wherein the area of the p-type electrode decreases as the plurality of LEDs are disposed more adjacent to edge portions of the active area.

3. The wafer of claim 2, wherein the area of the p-type electrode decreases as the plurality of LEDs are disposed more adjacent to a plurality of corners of the active area.

4. The wafer of claim 1, wherein in the plurality of LEDs, the area of the p-type electrode decreases as the plurality of LEDs are disposed more adjacent to a center of the active area.

5. The wafer of claim 1, wherein the area of the p-type electrode increases as the plurality of LEDs are disposed more adjacent to an intermediate area between a center of the active area and edge portions of the active area.

6. The wafer of claim 5, wherein the area of the p-type electrode increases as the plurality of LEDs are disposed more adjacent to an intermediate area between the center of the active area and a plurality of corners of the active area.

7. The wafer of claim 1, wherein the indium composition of the emission layer increases as the plurality of LEDs are disposed more adjacent to edge portions of the active area.

8. The wafer of claim 1, wherein the indium composition of the emission layer increases as the plurality of LEDs are disposed more adjacent to a center of the active area.

9. The wafer of claim 8, wherein the indium composition of the emission layer decreases as the plurality of LEDs are disposed more adjacent to an intermediate area between the center of the active area and edge portions of the active area.

10. The wafer of claim 9, wherein the indium composition of the emission layer decreases as the plurality of LEDs are disposed more adjacent to an intermediate area between the center of the active area and a plurality of corners of the active area.

11. The wafer of claim 1, wherein areas of same radius from a central region of the active area have same indium compositions.

12. The wafer of claim 1, wherein the emission layer is grown by a metal organic chemical vapor deposition (MOCVD) process.

13. The wafer of claim 1, wherein the p-type electrodes of the plurality of LEDs are formed symmetrically with respect to a center of the active area.

14. A wafer, comprising:
a substrate including an active area;
a first light emitting diode (LED) disposed on the active area and including a first p-type electrode; and
a second LED disposed on the active area and including a second p-type electrode,
wherein a size of the first p-type electrode is smaller than a size of the second p-type electrode,
wherein the first LED further includes a first emission layer,
wherein the second LED further includes a second emission layer, and
wherein the first emission layer includes more indium than the second emission layer.

15. The wafer of claim 14, wherein when current densities of currents supplied to the first emission layer and the second emission layer are the same, the first emission layer emits light having a longer wavelength than a wavelength of the second emission layer.

16. The wafer of claim 14, wherein the first emission layer and the second emission layer are one of a green emission layer or a blue emission layer.

17. The wafer of claim 14, wherein the first LED is disposed more adjacent to a plurality of corners of the active area than the second LED.

18. The wafer of claim 14, wherein the first LED is disposed more adjacent to a center of the active area than the second LED.

19. The wafer of claim 14, wherein when a same current is applied to the first p-type electrode and the second p-type electrode, a current density in the first p-type electrode is higher than a current density in the second p-type electrode.

* * * * *